United States Patent
Kudoh et al.

(10) Patent No.: US 9,640,677 B2
(45) Date of Patent: May 2, 2017

(54) SOLAR CELL, SOLAR CELL MODULE

(71) Applicant: SANYO Electric Co., Ltd., Osaka (JP)

(72) Inventors: Yoshiyuki Kudoh, Shiga (JP); Tsuyoshi Takahama, Osaka (JP); Mitsuaki Morigami, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/546,523

(22) Filed: Nov. 18, 2014

(65) Prior Publication Data

US 2015/0075609 A1  Mar. 19, 2015

Related U.S. Application Data

(63) Continuation of application No. PCT/JP2012/064711, filed on Jun. 7, 2012.

(51) Int. Cl.
*H01L 31/0224* (2006.01)
*H01L 31/05* (2014.01)

(52) U.S. Cl.
CPC ........... *H01L 31/022433* (2013.01); *H01L 31/022441* (2013.01); *H01L 31/0516* (2013.01); *Y02E 10/50* (2013.01)

(58) Field of Classification Search
CPC ..... H01L 31/00; H01L 31/02; H01L 31/0216; H01L 31/02167; H01L 31/0224; H01L 31/022425; H01L 31/022441
See application file for complete search history.

(56) References Cited

U.S. PATENT DOCUMENTS

| 5,494,643 A * | 2/1996 | Kennedy, III | B01J 19/122 422/186 |
| 8,993,875 B2 | 3/2015 | Funakoshi | |
| 2006/0065298 A1* | 3/2006 | Nakashima | H01L 31/022425 136/256 |
| 2009/0260672 A1 | 10/2009 | Taira | |
| 2010/0031999 A1 | 2/2010 | Mishima et al. | |
| 2011/0094562 A1 | 4/2011 | Funakoshi | |
| 2012/0006380 A1* | 1/2012 | Mikami | H01L 31/042 136/244 |

(Continued)

FOREIGN PATENT DOCUMENTS

| JP | 2009-266848 A | 12/2009 |
| JP | 2010016074 A | 1/2010 |

(Continued)

*Primary Examiner* — Christina Chern
(74) *Attorney, Agent, or Firm* — Mots Law, PLLC

(57) ABSTRACT

Disclosed is a solar cell that comprises a photoelectric conversion body, a first electrode including a first finger portion that is placed on one main surface of the photoelectric conversion body and extends in first direction, a second electrode including a second finger portion which is placed on the one main surface of the photoelectric conversion body to be adjacent to the first finger portion in second direction intersecting the first direction and extends in the first direction, a first insulating layer covering at least part of a tip end portion of the first finger portion, which tip end portion is located on first side in the first direction, and a second insulating layer covering at least part of a tip end portion of the second finger portion, which tip end portion is located on a second side in the first direction.

11 Claims, 5 Drawing Sheets

(56) References Cited

U.S. PATENT DOCUMENTS

| | | | | |
|---|---|---|---|---|
| 2012/0037203 A1* | 2/2012 | Sainoo | ............ | B32B 17/10018 |
| | | | | 136/244 |
| 2012/0325286 A1* | 12/2012 | Hishida | ............... | H01L 31/0512 |
| | | | | 136/244 |
| 2015/0228832 A1 | 8/2015 | Funakoshi | | |

FOREIGN PATENT DOCUMENTS

| | | | | | |
|---|---|---|---|---|---|
| JP | 2010041012 A | | 2/2010 | | |
| JP | 2011187567 A | | 9/2011 | | |
| WO | 2010116973 A1 | | 10/2010 | | |
| WO | WO 2011/108634 | * | 9/2011 | ........... | H01L 31/042 |

* cited by examiner

SOLAR CELL, SOLAR CELL MODULE

CROSS REFERENCE TO RELATED APPLICATIONS

This application is a continuation application of International Application No. PCT/JP2012/064711, filed on Jun. 7, 2012, entitled "SOLAR CELL MODULE", the entire contents of which are incorporated herein by reference.

TECHNICAL FIELD

This disclosure relates to a solar cell, and a solar cell module.

BACKGROUND ART

In recent years, a solar cell module including back contact solar cells is known as a solar cell module, which can offer excellent photoelectric conversion efficiency (see, for example, Japanese Patent Application Publication No. 2009-266848: Patent Document 1). A back contact solar cell has both of a p-side electrode and an n-side electrode on the back surface of a photoelectric conversion body.

SUMMARY OF THE INVENTION

A back contact solar cell has both of a p-side electrode and an n-side electrode provided on the back surface side. Thus, to connect such a back contact solar cell and a wiring member together, the solar cell and the wiring member need to be positioned relative to each other with high positioning accuracy. For this reason, a back contact solar cell has a problem of being difficult to be connected to a wiring member.

A solar cell according to an embodiment includes a photoelectric conversion body, a first electrode, a second electrode, a first insulating layer, and a second insulating layer. The first electrode includes a first finger portion. The first finger portion is placed on one main surface of the photoelectric conversion body. The first finger portion extends in first direction. The second electrode includes a second finger portion. The second finger portion is placed on the one main surface of the photoelectric conversion body. The second finger portion is placed to be adjacent to the first finger portion in second direction intersecting the first direction. The second finger portion extends in the first direction. The first insulating layer covers at least part of a tip end portion of the first finger portion, which tip end portion is located on first side in the first direction. The second insulating layer covers at least part of a tip end portion of the second finger portion, which tip end portion is located on second side in the first direction.

A solar cell module according to an embodiment includes the solar cell described above and a wiring member electrically connected to the solar cell.

In a method of manufacturing a solar cell according to an embodiment, a first lower electrode layer and a second lower electrode layer are formed on one main surface of a photoelectric conversion body, the first lower electrode layer extending in first direction, the second lower electrode layer extending in the first direction and being adjacent to the first lower electrode layer in the second direction intersecting the first direction. A first insulating layer is formed such that the first insulating layer covers at least part of a tip end portion of the first lower electrode layer, which tip end portion is located on first side in the first direction, and a second insulating layer is formed such that the second insulating layer covers at least part of a tip end portion of the second lower electrode layer, which tip end portion is located on a second side in the first direction. A first upper electrode layer is formed on a portion of the first lower electrode layer, which portion is not covered by the first insulating layer, to obtain a first electrode including a first finger portion including the first lower electrode layer and the first upper electrode layer. A second upper electrode layer is formed on a portion of the second lower electrode layer, which portion is not covered by the second insulating layer, to obtain a second electrode including a second finger portion including the second lower electrode layer and the second upper electrode layer.

In a method of manufacturing a solar cell module according to an embodiment, a first lower electrode layer and a second lower electrode layer are formed on one main surface of a photoelectric conversion body, the first lower electrode layer extending in first direction, the second lower electrode layer extending in the first direction and being adjacent to the first lower electrode layer in the second direction intersecting the first direction. A first insulating layer is formed such that the first insulating layer covers at least part of a tip end portion of the first lower electrode layer, which tip end portion is located on first side in the first direction, and a second insulating layer is formed such that the second insulating layer covers at least part of a tip end portion of the second lower electrode layer, which tip end portion is located on a second side in the first direction. A first upper electrode layer is formed on a portion of the first lower electrode layer, which portion is not covered by the first insulating layer, to obtain a first electrode including a first finger portion including the first lower electrode layer and the first upper electrode layer. A second upper electrode layer is formed on a portion of the second lower electrode layer, which portion is not covered by the second insulating layer, to obtain a second electrode including a second finger portion including the second lower electrode layer and the second upper electrode layer. Multiple solar cells are fabricated in this way. The multiple solar cells are electrically connected together with a wiring member.

EMBODIMENTS

Figure 1:
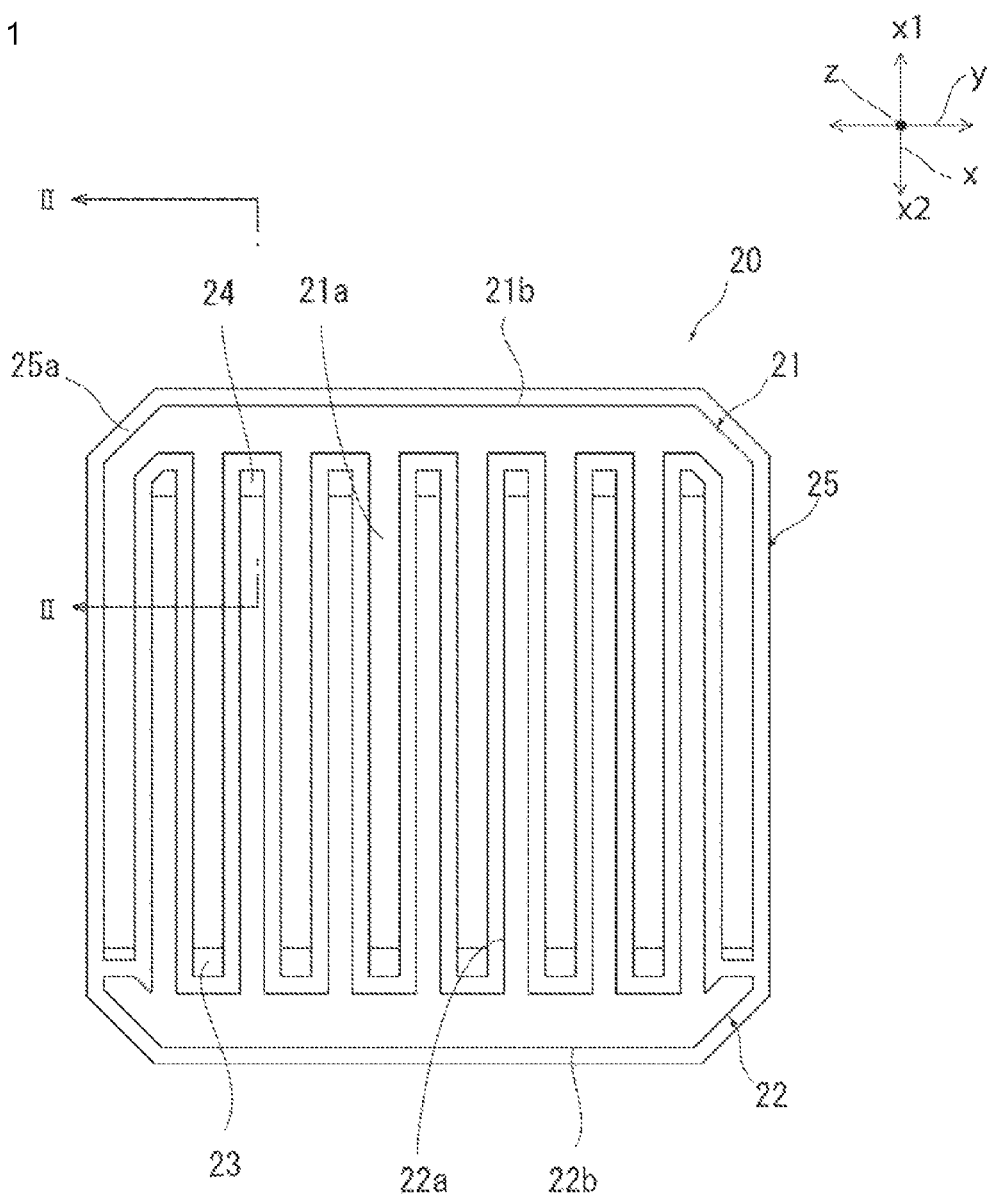
FIG. 1 is a schematic diagram of the back surface of a solar cell according to one embodiment.

Hereinafter, embodiments are described. It should be noted that the following embodiments are provided just for illustrative purposes. The invention should not be limited at all to the following embodiments.

In the drawings referred to in the embodiments and other parts, components having substantially the same function are referred to with the same reference numeral. In addition, the drawings referred to in the embodiments and other parts are illustrated schematically, and the dimensional ratio and the like of objects depicted in the drawings are different from those of actual objects in some cases. The dimensional ratio and the like of objects are also different among the drawings in some cases. The specific dimensional ratio and the like of objects should be determined with the following description taken into consideration.

(Solar Cell 20)

Figure 2:
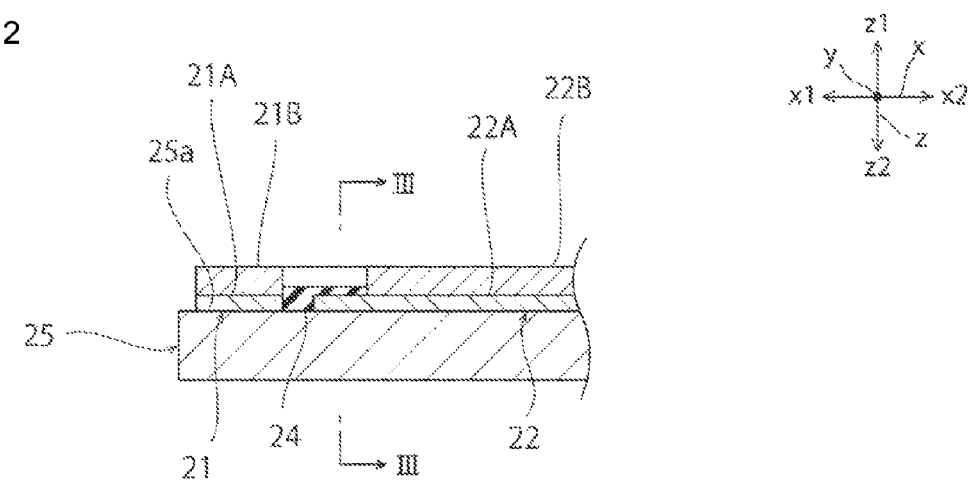
FIG. 2 is a schematic sectional diagram taken along line II-II in FIG. 1.
Figure 3:
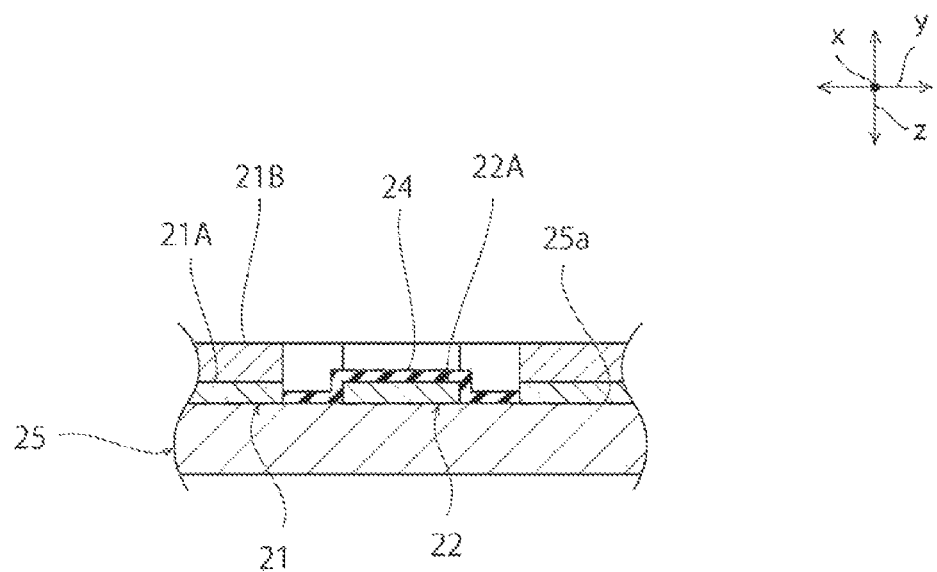
FIG. 3 is a schematic sectional diagram taken along line III-III in FIG. 2.

As illustrated in FIGS. 1 to 3, solar cell 20 includes photoelectric conversion body 25. Photoelectric conversion body 25 is not particularly limited as long as it is a member configured to generate carriers such as electrons and holes by receiving light. Photoelectric conversion body 25 may include, for example, a semiconductor substrate of one conductivity type, a first semiconductor layer of another conductivity type placed on one main surface of the semiconductor substrate, and a second semiconductor layer of the one conductivity type placed on the one main surface of the semiconductor substrate in at least part of a portion where the first semiconductor layer is not placed. In this case, a p-type surface is formed by the surface of one of the first and second semiconductor layers, and an n-type surface is formed by the surface of the other one. A substantially intrinsic i-type semiconductor layer may be placed between the semiconductor substrate and each of the first and second semiconductor layers, the i-type semiconductor layer having a thickness substantially not contributing to power generation, e.g., about several angstroms (Å) to 250 Å.

Photoelectric conversion body 25 may be formed of, for example, a semiconductor substrate provided with a p-type dopant diffusion region and an n-type dopant diffusion region, each being exposed on the one main surface.

As illustrated in FIG. 1, first and second electrodes 21 and 22 are placed on main surface 25a of photoelectric conversion body 25. Specifically, one of first and second electrodes 21 and 22 is provided on the p-type surface and forms a p-side electrode for collecting holes, and the other one is provided on the n-type surface and forms an n-side electrode for collecting electrons.

First electrode 21 has multiple first finger portions 21a and first bus bar portion 21b. Multiple first finger portions 21a are arranged with spaces in between in a y-axis direction which intersects an x-axis direction. Multiple first finger portions 21a each extend in the x-axis direction. Multiple first finger portions 21a are electrically connected to first bus bar portion 21b. First bus bar portion 21b is placed on an x1 side of multiple first finger portions 21a. First bus bar portion 21b extends in the y-axis direction.

Second electrode 22 has multiple second finger portions 22a and second bus bar portion 22b. Multiple second finger portions 22a are arranged with spaces in between in the y-axis direction. Multiple second finger portions 22a each extend in the x-axis direction. Multiple second finger portions 22a are electrically connected to second bus bar portion 22b. Second bus bar portion 22b is placed on an x2 side of multiple second finger portions 22a. Second bus bar portion 22b extends in the y-axis direction.

Second finger portions 22a and first finger portions 21a interdigitate and are provided alternately in the y-axis direction. Thus, first finger portions 21a and second finger portions 22a are adjacent to each other in the y-axis direction. Each first finger portion 21a is placed between two second finger portions 22a. Each second finger portion 22a is placed between two first finger portions 21a.

Tip end portions of first finger portions 21a on the opposite side from first bus bar portion 21b face second bus bar portion 22b in the x-axis direction. Tip end portions of second finger portions 22a on the opposite side from second bus bar portion 22b face first bus bar portion 21b in the x-axis direction.

Although each of first and second electrodes 21 and 22 has a bus bar portion in this embodiment, the first and second electrodes in the invention do not have to have the bus bar portions.

First and second electrodes 21 and 22 can be formed from any appropriate conductive material. First and second electrodes 21 and 22 can be formed from, for example, at least one of metals such as silver, aluminum, copper, and tin.

First and second electrodes 21 and 22 are each formed of a stack of conductive layers. Specifically, as illustrated in FIGS. 2 and 3, first electrode 21 has first lower electrode layer 21A and first upper electrode layer 21B. Second electrode 22 has second lower electrode layer 22A and second upper electrode layer 22B.

First and second lower electrode layers 21A and 22A are each provided on main surface 25a of photoelectric conversion body 25. First and second lower electrode layers 21A and 22A are each a layer formed by CVD (Chemical Vapor Deposition), sputtering, or other method.

First upper electrode layer 21B is placed on first lower electrode layer 21A. First upper electrode layer 21B is formed by plating using first lower electrode layer 21A as a seed electrode. To be more specific, first upper electrode layer 21B is placed on the substantially entire portion of first lower electrode layer 21A, excluding the x2-side tip end portions of the portions of first lower electrode layer 21A which form first finger portions 21a. For this reason, the x2-side tip end portions of first finger portions 21a are thinner than other portions of first finger portions 21a by an amount corresponding to the thickness of first upper electrode layer 21B.

Second upper electrode layer 22B is placed on second lower electrode layer 22A. Second upper electrode layer 22B is formed by plating using second lower electrode layer 22A as a seed electrode. To be more specific, second upper electrode layer 22B is placed on the substantially entire portion of second lower electrode layer 22A, excluding the x1-side tip end portions of the portions of second upper electrode layer 22B which form second finger portions 22a. For this reason, the x1-side tip end portions of second finger portions 22a are thinner than other portions of second finger portions 22a by an amount corresponding to the thickness of second upper electrode layer 22B.

First lower electrode layer 21A and second lower electrode layer 22A have substantially the same thickness. Thus, the tip end portions of first finger portions 21a on the x2 side in the x-axis direction are smaller than tip end portions of second finger portions 22a on the x2 side in the x-axis direction. The tip end portions of second finger portions 22a on the x1 side in the x-axis direction are smaller than tip end portions of first finger portions 21a on the x1 side in the x-axis direction.

At least part of the tip end portion of each first finger portion 21a on the x2 side in the x-axis direction is covered by first insulating layer 23. Specifically, in this embodiment, first insulating layer 23 covers substantially the entire tip end portion of each first finger portion 21a on the x2 side in the x-axis direction. Note that the part of first finger portion 21a covered by first insulating layer 23 is formed only of first lower electrode layer 21A out of first lower electrode layer 21A and first upper electrode layer 21B.

First insulating layer 23 is provided such that the total thickness of the tip end portion of first finger portion 21a on the x2 side in the x-axis direction and first insulating layer 23 placed thereon is smaller than the thickness of the tip end portion of second finger portion 22a on the x2 side in the x-axis direction. The total thickness of the tip end portion of first finger portion 21a on the x2 side in the x-axis direction and first insulating layer 23 placed thereon is preferably smaller than or equal to, or more preferably 0.9 times or less of, the thickness of the tip end portion of second finger portion 22a on the x2 side in the x-axis direction.

At least part of the tip end portion of each second finger portion 22a on the x1 side in the x-axis direction is covered by second insulating layer 24. Specifically, in this embodiment, second insulating layer 24 covers substantially the entire tip end portion of each second finger portion 22a on the x1 side in the x-axis direction. Note that the part of second finger portion 22a covered by second insulating layer 24 is formed only of second lower electrode layer 22A out of second lower electrode layer 22A and second upper electrode layer 22B.

Second insulating layer 24 is provided such that the total thickness of the tip end portion of second finger portion 22a on the x1 side in the x-axis direction and second insulating layer 24 placed thereon is smaller than the thickness of the tip end portion of first finger portion 21a on the x1 side in the x-axis direction. The total thickness of the tip end portion of second finger portion 22a on the x1 side in the x-axis direction and second insulating layer 24 placed thereon is preferably smaller than or equal to, or more preferably 0.9 times or less of, the thickness of the tip end portion of first finger portion 21a on the x1 side in the x-axis direction.

First and second insulating layers 23 and 24 can be formed from any appropriate insulating material. For example, first and second insulating layers 23 and 24 can be formed from an insulating resin, an inorganic oxide, or the like. Concrete examples of resins preferably usable as a material for first and second insulating layers 23 and 24 include an epoxy resin, acrylic resin, a silicone resin, an olefin resin, an ethylene-vinyl acetate resin, and the like. Concrete examples of inorganic oxides preferably usable as a material for first and second insulating layers 23 and 24 include $Al_2O_3$, SiN, $SiO_2$, and the like.

(Solar Cell Module 1)

Figure 4:
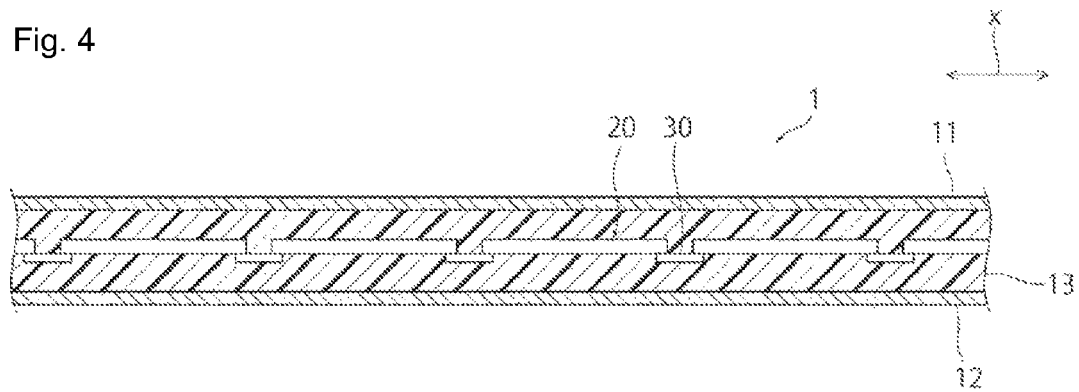
FIG. 4 is a schematic sectional diagram of a solar cell module according to one embodiment.

Solar cell module 1 illustrated in FIG. 4 includes solar cell 20 described above. Specifically, solar cell module 1 includes multiple solar cells 20. Multiple solar cells 20 are placed within filler layer 13 filled between light-receiving-surface protection member 11 and back-surface-side protection member 12. Light-receiving-surface protection member 11 and back-surface-side protection member 12 can be each formed of, for example, a glass plate, a resin plate, a resin sheet, or the like. Filler layer 13 can be formed from, for example, a crosslinkable resin such as an ethylene-vinyl acetate copolymer (EVA) resin or a non-crosslinkable resin such as a polyolefin resin.

Figure 5:
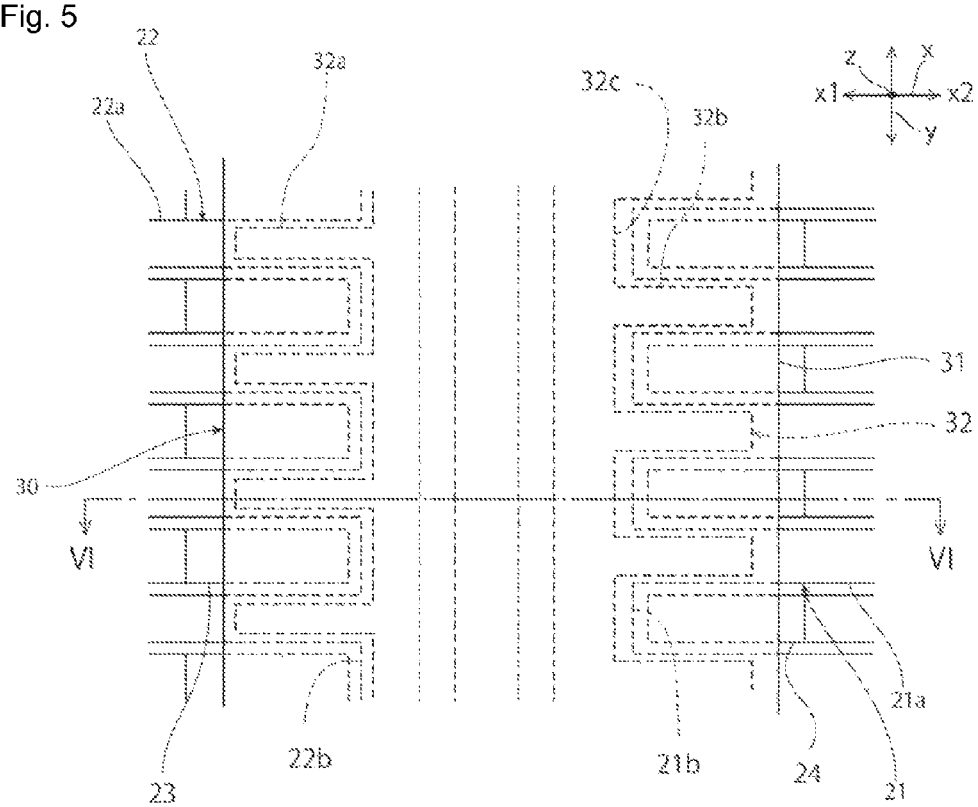
FIG. 5 is a schematic plan view illustrating how a wiring member is connected to the solar cells according to the one embodiment.
Figure 6:
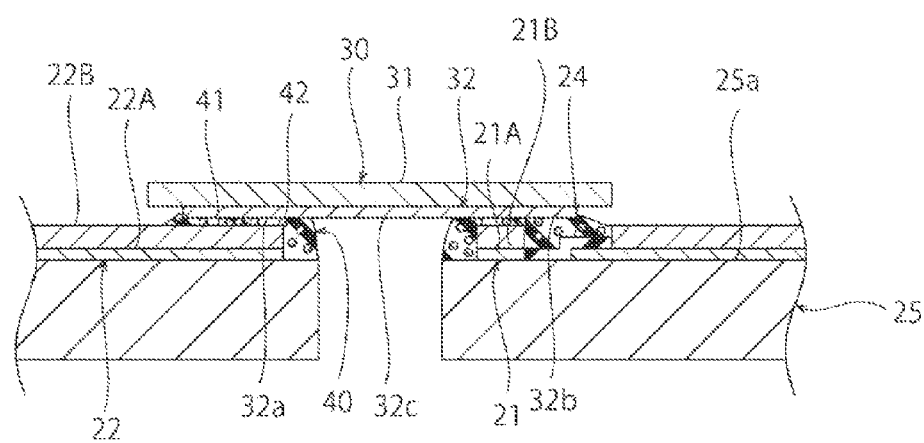
FIG. 6 is a schematic sectional diagram taken along line VI-VI in FIG. 5.

Multiple solar cells 20 of solar cell module 1 are electrically connected to one another with wiring members 30. As illustrated in FIGS. 5 and 6, each wiring member 30 has wiring-member main body 31 and conductive layer 32. Wiring-member main body 31 is substantially rectangular. Wiring-member main body 31 is made of an insulating material. Wiring-member main body 31 can be formed from, for example, a resin.

Conductive layer 32 is placed on a surface of wiring-member main body 31 on the solar cell 20 side. Wiring-member main body 31 electrically connects first electrode 21 of one of two solar cells 20 adjacent in the x direction to second electrode 22 of the other solar cell 20. Conductive layer 32 has multiple first connection portions 32a, multiple second connection portions 32b, and conductive-layer main body 32c. Multiple first connection portions 32a and multiple second connection portions 32b are each electrically connected to conductive-layer main body 32c.

Multiple first connection portions 32a extend from conductive-layer main body 32c in the x-axis direction. Multiple first connection portions 32a are arranged with spaces in between in the y-axis direction. Multiple first connection portions 32a extend over to second finger portions 22a. Multiple first connection portions 32a are electrically connected to second bus bar portion 22b and are also electrically connected to end portions of second finger portions 22a on the second bus bar portion 22b side.

Multiple second connection portions 32b extend from conductive-layer main body 32c in the x-axis direction. Multiple second connection portions 32b are arranged with spaces in between in the y-axis direction. Multiple second connection portions 32b extend over to first finger portions 21a. Multiple second connection portions 32b are electrically connected to first bus bar portion 21b and are also electrically connected to end portions of first finger portions 21a on the first bus bar portion 21b side.

As illustrated in FIG. 6, wiring member 30 and solar cell 20 are bonded together via resin adhesive layer 40. Resin adhesive layer 40 may be formed only from a hardened resin adhesive, but in this embodiment, includes hardened resin adhesive 41 and conductive material 42. Conductive layer 32 and solar cell 20 are electrically connected to each other via this conductive material 42. Conductive material 42 can be formed of, for example, particles of conductive material, insulating particles coated with a conductive layer, or the like.

As described above, in this embodiment, at least part of the tip end portion of each first finger portion 21a is covered with first insulating layer 23. Thus, even if the accuracy of positioning between wiring member 30 and solar cell 20 is low, it can be prevented that a portion of conductive layer 32 of wiring member 30 which is to be electrically connected to second electrode 22 is electrically connected to first finger portion 21a. Likewise, at least part of the tip end portion of each second finger portion 22a is covered with second insulating layer 24. Thus, even if the accuracy of positioning between wiring member 30 and solar cell 20 is low, it can be prevented that a portion of conductive layer 32 of wiring member 30 which is to be electrically connected to first electrode 21 is electrically connected to second finger portion 22a. Hence, solar cell 20 and wiring member 30 can be connected to each other easily.

From the perspective of more effective prevention of conductive layer 32 from being connected to the finger portions where it should not be connected, the maximum particle size of conductive material 42 should preferably be smaller than the thickness of each of first and second insulating layers 23 and 24. The maximum particle size of conductive material 42 is preferably less than the thickness of each of first and second insulating layers 23 and 24, and is more preferably less than or equal to two thirds of the thickness of each of first and second insulating layers 23 and 24.

Further, as illustrated in FIG. 5, first insulating layer 23 is provided to extend beyond conductive layer 32 to the x1 side in the x direction, and second insulating layer 24 is provided to extend beyond conductive layer 32 to the x2 side in the x direction. Thereby, conductive layer 32 can be further effectively prevented from being connected to the finger portions where it should not be connected.

Moreover, the total thickness of the x2-side tip end portion of first finger portion 21a and first insulating layer 23 is smaller than the thickness of the x2-side tip end portion of second finger portion 22a, and the total thickness of the x1-side tip end portion of second finger portion 22a and second insulating layer 24 is smaller than the thickness of the x1-side tip end portion of first finger portion 21a. Thereby, as illustrated in FIG. 6, space for the resin adhesive to come out from between the electrode of solar cell 20 and conductive layer 32 of wiring member 30 can be created. This lowers pressing pressure necessary for bonding wiring member 30 and solar cell 20 together. In addition, wiring member 30 and solar cell 20 can be electrically connected to each other easily and reliably.

Figure 7:
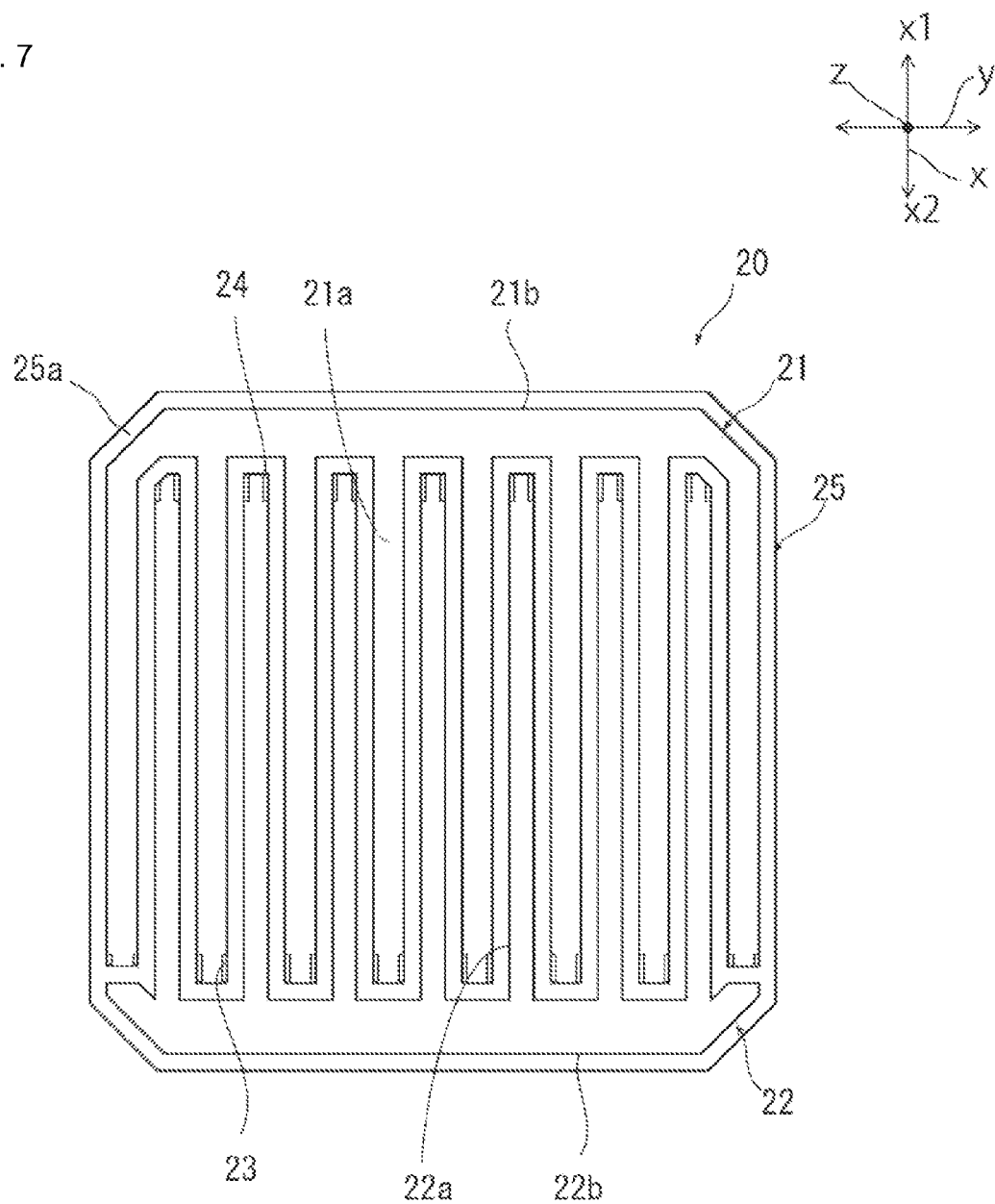
FIG. 7 is a schematic diagram of the back surface of a solar cell according to a modification.

In this embodiment, first insulating layer 23 covers substantially the entire tip end portion of each first finger portion 21a, and second insulating layer 24 covers substantially the entire tip end portion of second finger portion 22a. However, the invention is not limited to such a configuration. For instance, as illustrated in FIG. 7, first insulating layer 23 may cover for example only edge portions of the x2-side tip end portion of first finger portion 21a, the edge portions being adjacent to second finger portions 22a, and second insulating layer 24 may cover for example only edge portions of the x1-side tip end portion of second finger portion 22a, the edge portions being adjacent to first finger portions 21a. The effect described above can be offered with such a configuration, as well.

Figure 8:
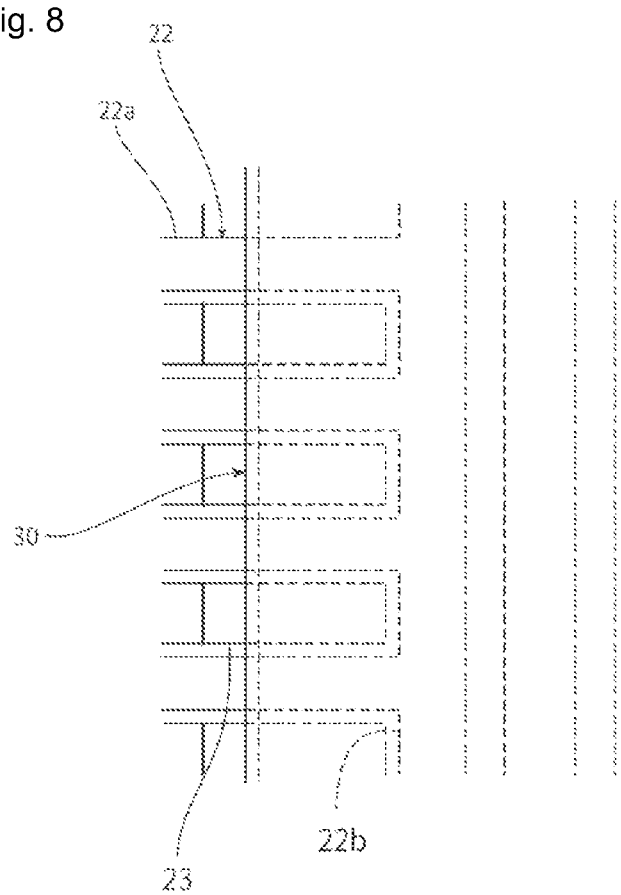
FIG. 8 is a schematic plan view illustrating how a wiring member is connected to the solar cells according to the modification.
Figure 8:
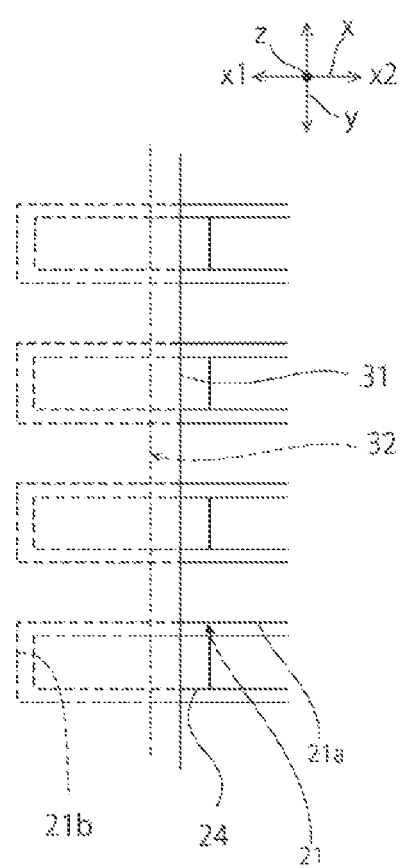

In addition, the shape of conductive layer 32 of wiring member 30 used in this embodiment is not limited to the one illustrated in FIG. 5. For example, as illustrated in FIG. 8, conductive layer 32 may be substantially rectangular. Specifically, first connection portions 32a may be integrally provided, and second connection portions 32b may be integrally provided.

For example, solar cell 20 can be manufactured by the following manufacturing method.

First, first and second lower electrode layers 21A and 22A are formed on main surface 25a of photoelectric conversion body 25. First and second lower electrode layers 21A and 22A can be formed by, for example, CVD (Chemical Vapor Deposition), sputtering, or other method.

Next, first and second insulating layers 23 and 24 are formed. First and second insulating layers 23 and 24 can be formed by, for example, printing a resin material or sputtering an inorganic material. First and second insulating layers 23 and 24 may be formed also on a portion of main surface 25a where first and second lower electrode layers 21A and 22A are not provided. In such a case, first insulating layer 23 and second insulating layer 24 may be provided to be integral with each other.

Next, first and second upper electrode layers 21B and 22B are formed on first and second lower electrode layers 21A, 22A. First and second electrodes 21 and 22 can be formed through the above steps. First and second upper electrode layers 21B and 22B can be formed by plating by feeding power to first and second lower electrode layers 21A, 22A.

According to the embodiment above solar cells that can be easily connected to a wiring member are provided.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A solar cell comprising:
a photoelectric conversion body including a semiconductor substrate of one conductivity type, a first semiconductor layer of another conductivity type placed on portions of one main surface of the semiconductor substrate, and a second semiconductor layer of the one conductivity type placed on other portions of the one main surface of the semiconductor substrate;
a first electrode including first finger portions placed on one main surface of the photoelectric conversion body and extending in a first direction on the one main surface of the photoelectric conversion body, wherein the first direction is opposite to a second direction, and including a first bus bar portion extending in a third direction on the one main surface of the photoelectric conversion body such that the first finger portions extend from the first bus bar portion;
a second electrode including second finger portions placed on the one main surface of the photoelectric conversion body and extending in the second direction and a second bus bar portion extending in the third direction on the one main surface of the photoelectric conversion body such that the second finger portions extend from the second bus bar portion, wherein the first finger portions and the second finger portions are adjacent to one another in the third direction, wherein the third direction intersects the first and second directions;
a first insulating layer covering at least part of a tip end portion of each of the first finger portions on the one main surface of the photoelectric conversion body, wherein the tip end portion of each first finger portion is located at an end of each first finger portion opposite from where the first finger portion extends from the first bus bar portion; and
a second insulating layer covering at least part of a tip end portion of each of the second finger portions on the one main surface of the photoelectric conversion body, wherein the tip end portion of each second finger portion is located at an end of each second finger portion opposite from where the second finger portion extends from the second bus bar portion,
wherein
the tip end portions having the first insulating layer are provided adjacent to the second bus bar portion, and the tip end portions having the second insulating layer are provided adjacent to the first bus bar portion,
a thickness of the tip end portion of each of the first finger portions is smaller than a thickness of an end portion of each of the second finger portions, wherein the end portion of each second finger portion is located at an end of each second finger portion at where the second finger portion extends from the second bus bar portion, and
a thickness of the tip end portion of each of the second finger portions is smaller than a thickness of an end portion of each of the first finger portions, wherein the end portion of each first finger portion is located at an end of each first finger portion at where the first finger portion extends from the first bus bar portion.

2. The solar cell according to claim 1, wherein
the first finger portions and the second finger portions are provided alternately in the third direction.

3. The solar cell according to claim 1, wherein
a total thickness of the tip end portion of each of the first finger portions and the first insulating layer is smaller than the thickness of the end portion of each of the second finger portions, and
a total thickness of the tip end portion of each of the second finger portions and the second insulating layer is smaller than the thickness of the end portion of each of the first finger portions.

4. The solar cell according to claim 1, wherein
the first insulating layer covers at least an edge portion of the tip end portion of each of the first finger portions, the edge portion facing the second bus bar portion, and
the second insulating layer covers at least an edge portion of the tip end portion of each of the second finger portions, the edge portion facing the first bus bar portion.

5. A solar cell module comprising:
the solar cell according to claim 1;
a light-receiving-surface protection member;
a back-surface-side protection member;
a filler layer interposed between the light-receiving-surface protection member and the back-surface-side protection member; and
a wiring member electrically connected to the solar cell.

6. The solar cell module according to claim 5, wherein
the wiring member includes
a wiring-member main body made of an insulating material, and
a conductive layer placed on the wiring-member main body and electrically connected to the first finger portions.

7. The solar cell module according to claim 5, further comprising
a resin adhesive layer bonding the wiring member and the solar cell together.

8. The solar cell module according to claim 7, wherein
the resin adhesive layer includes a conductive material, and
a maximum particle size of the conductive material is smaller than a thickness of the second insulating layer.

9. The solar cell module according to claim 6, wherein
the second insulating layer extends further than an edge of the conductive layer in the first direction.

10. The solar cell module according to claim 6, wherein
the conductive layer of the wiring member includes a conductive-layer main body and first connection portions extending from the conductive-layer main body in the second direction,
the first connection portions are provided at positions overlapping with the first finger portions such that the first connection portions are not electrically connected to the second finger portions.

11. The solar cell module according to claim 10, wherein
the wiring-member main body overlaps the second finger portions in areas between the first connection portions.

* * * * *